US005517542A

United States Patent [19]

Huq

[11] Patent Number: 5,517,542
[45] Date of Patent: *May 14, 1996

[54] SHIFT REGISTER WITH A TRANSISTOR OPERATING IN A LOW DUTY CYCLE

[75] Inventor: Ruquiya I. A. Huq, Plainsboro, N.J.

[73] Assignee: Thomson Consumer Electronics, S.A., France

[*] Notice: The term of this patent shall not extend beyond the expiration date of Pat. No. 5,410,583.

[21] Appl. No.: 398,823

[22] Filed: Mar. 6, 1995

[51] Int. Cl.[6] .................................................. G11C 19/00
[52] U.S. Cl. ........................ 377/78; 377/76; 377/105; 377/79; 327/212
[58] Field of Search ............................ 377/75, 76, 79, 377/78, 105; 327/212

[56] References Cited

U.S. PATENT DOCUMENTS

| | | | |
|---|---|---|---|
| 3,835,302 | 9/1974 | Au | 377/105 |
| 4,741,005 | 4/1988 | Tanigawa | 377/105 |
| 5,055,709 | 10/1991 | Smith | 327/203 |
| 5,055,720 | 10/1991 | Tiede | 327/53 |
| 5,136,622 | 8/1992 | Plus | 377/79 |
| 5,170,155 | 12/1992 | Plus et al. | 340/784 |
| 5,222,082 | 6/1993 | Plus | 377/79 |
| 5,410,583 | 4/1995 | Weisbrod et al. | 377/75 |

*Primary Examiner*—John S. Heyman
*Attorney, Agent, or Firm*—Joseph S. Tripoli; Joseph J. Laks; Sammy S. Henig

[57] ABSTRACT

A shift register for scanning a liquid crystal display includes cascaded stages. A given stage is formed with an input transistor switch that is responsive to an output pulse of a stage upstream in the chain of the cascaded stages. An output pulse of the given stage is produced in a pull-up transistor of a push-pull amplifier. A third transistor responsive to an output signal of a stage downstream of the given stage applies a control signal to a gate electrode of the pull-down transistor to render the pull-down transistor conductive.

7 Claims, 4 Drawing Sheets

SHIFT REGISTER WITH A TRANSISTOR OPERATING IN A LOW DUTY CYCLE

This invention relates generally to drive circuits for display devices and particularly to a shift register for applying row select line signals to row select lines in a liquid crystal display (LCD).

Display devices, such as liquid crystal displays, are composed of a matrix of pixels arranged horizontally in rows and vertically in columns. The video information to be displayed is applied as brightness (gray scale) signals to data lines which are individually associated with each column of pixels. The rows of pixels are sequentially scanned by signals that are developed in row select lines. The capacitance of the pixel associated with the activated row select line is charged to the various brightness levels in accordance with the level of the brightness signal applied to the individual columns via the corresponding data lines.

Amorphous silicon has been the preferable technology for fabricating liquid crystal displays because this material can be fabricated at low temperatures. Low fabrication temperature is important because it permits the use of standard, readily available and inexpensive substrate materials. However, the use of amorphous silicon thin film transistors (a-Si TFTs) in integrated peripheral pixel drivers causes design difficulties because of low mobility, threshold voltage drift and the availability of only N-type metal oxide semiconductor (N-MOS) enhancement transistors.

Select line drive circuitry is desirably fabricated directly onto the same substrate and concurrently with the fabrication of the liquid crystal cells. An example of a known scan or shift register that drives the row select lines is described in U.S. Pat. No. 5,222,082, which may be integrated with a liquid crystal display device. An output section of the register is arranged as a push-pull amplifier that may be formed by TFF's. When a given row is de-selected, a pulldown TFT of the push-pull amplifier is turned on for applying a suitable impedance at a terminal of a row line conductor of the de-selected row.

Each row line conductor is de-selected during the majority of an updating cycle or a frame time. Consequently, the pulldown TFT's are conductive most of the time or except when the row is selected. A switching, second TFT applies a switching voltage to a gate terminal of the pulldown TFT. It is desirable to reduce the duty cycle of the switching, second TFT that applies the drive voltage to the gate of the pulldown TFT to reduce the potential for over-stress of the switching second TFT.

A shift register, embodying an aspect of the invention, includes a source of a plurality of phase shifted clock signals, and a plurality of cascaded stages. A given one of the cascaded stages includes a first transistor of a push-pull amplifier responsive to a first clock signal of the clock signals for generating an output pulse at an output of the given stage. An input section is responsive to an output pulse developed at an output of a second of the cascaded stages when a clock signal that is phase shifted with respect to the first clock signal occurs. A control signal is generated at a control electrode of the first transistor. The control signal conditions the first transistor to generate the output pulse of the given stage when an active level of the first clock signal occurs. A second transistor of the push-pull amplifier is coupled to the output of the given stage for clamping the output to an inactive level of the output pulse. A switching, third transistor is responsive to an output pulse of a stage downstream of the given stage for applying a control signal to the second transistor.

Figure 1:
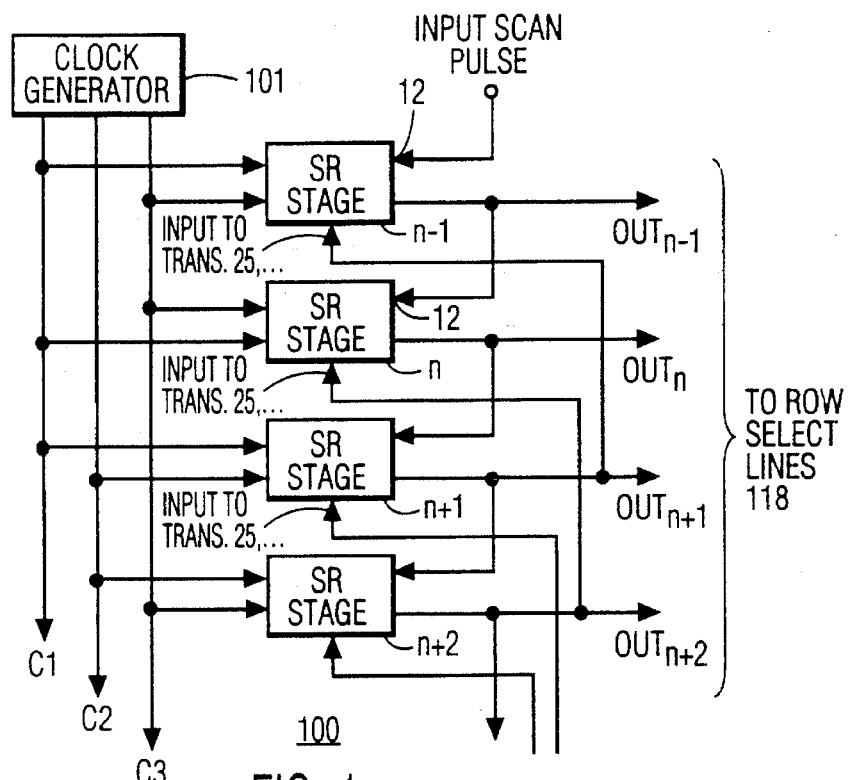
FIG. 1 illustrates a block diagram of a shift register including a plurality of cascaded stages.
Figure 2:
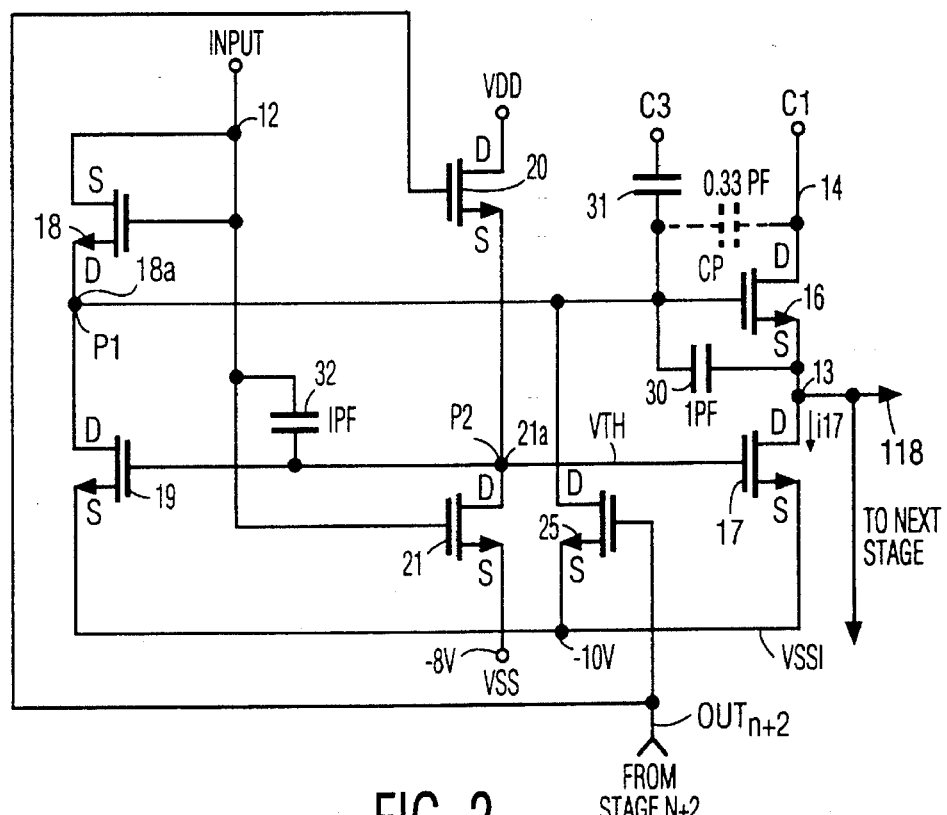
FIG. 2 illustrates a schematic diagram of a shift register stage, embodying an aspect of the invention, that can be used in the shift register of FIG. 1.

FIG. 2 illustrates an exemplary stage n, of a shift register 100 of FIG. 1. Shift register 100 of FIG. 1 drives row select lines 118 of a liquid crystal display matrix, not shown in FIG. 1. In shift register 100, stages n−1, n, n+1 and n+2 are coupled to one another in a cascade configuration. An output signal of a given stage is coupled to an input of the immediately following stage in the chain. For example, an output pulse $OUT_{n-1}$ of preceding stage n−1 in the chain of register 100 is coupled to an input terminal 12 of stage n of FIG. 2. Illustratively, only four stages, n−1, n, n+1 and n+2 are shown. However, the total number of stages n in the chain of register 100 is substantially larger. Shift register 100 may be referred to as a "walking one" shift register. This is so because a TRUE state propagates through register 100 during a video frame time.

Figure 3:
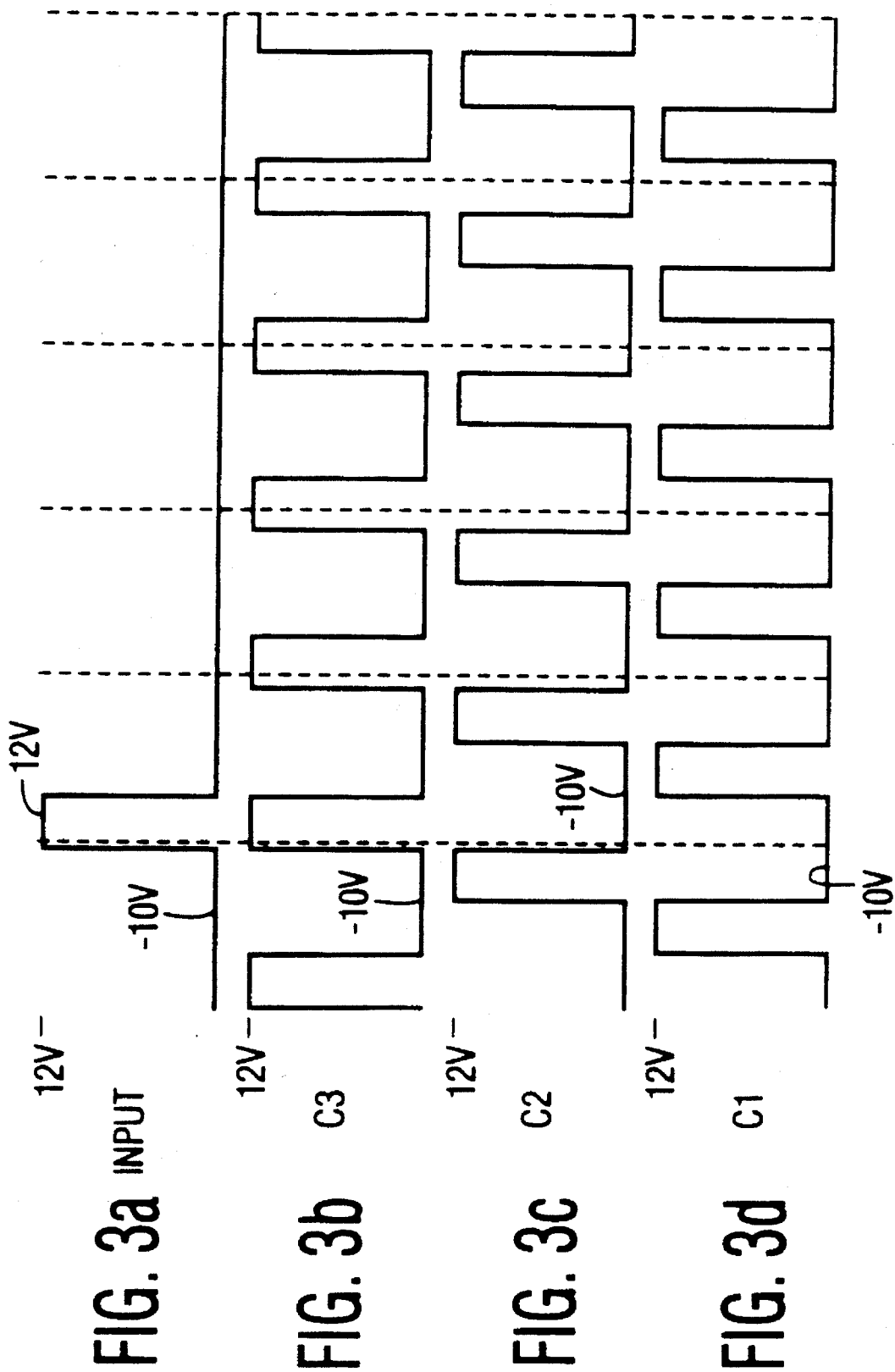
FIGS. 3a–3d are diagrams of the relative timing of the output signals and the respective clock signals occurring at respective nodes of the FIG. 1 shift register utilizing stages illustrated in FIG. 2.

A clock generator 101 of FIG. 1 produces a three-phase clock signal, (clock signals C1, C2 and C3) having waveforms that are shown in FIGS. 3d, 3c and 3b, respectively. The pulse of signal $OUT_{n-1}$ of FIG. 3a is produced when the pulse of clock signal C3 is applied to stage n−1 of FIG. 1. Similar symbols and numerals in FIGS. 1, 2 and 3a–3d indicate similar items or functions.

Signal $OUT_{n-1}$ of FIG. 1 is developed at input terminal 12 of stage n of FIG. 2. Signal $OUT_{n-1}$ at the HIGH level is coupled via a transistor 18 of FIG. 2 operating as a switch to a terminal 18a for developing a control signal P1. Immediately prior to the occurrence of clock signal C1, signal P1 at terminal 18a is boosted to a higher potential using a boot-strap operation by clock signal C3 that is applied to terminal 18a via a capacitor 31. Signal $OUT_{n-1}$ of stage n−1 that is coupled to input terminal 12 of stage n is also coupled to the gate electrode of a transistor 21. A drain of transistor 21 is coupled via a terminal 21a to a gate of a transistor 19 and to the gate electrode of a pull-down transistor 17. As a result, both transistors 19 and 17 are rendered non-conductive.

The HIGH level of signal P1 is temporarily stored in an inter-electrode capacitance, not shown, and in a capacitor 30. Signal P1 that is developed at the gate of an output transistor 16 conditions output transistor 16 for conduction. Clock signal C1 of FIG. 3d is coupled via transistor 16 to the output terminal 13 when terminal 18a is high. Interelectrode parasitic capacitances CP tend to bootstrap the potential at terminal 18a, providing extra drive to transistor 16. Consequently, an output pulse signal $OUT_n$ is developed at the output terminal 13 of register n. During this interval, pull-down transistor 17 is rendered non-conductive by the operation of transistor 21 and has no effect then on signal $OUT_n$.

Signal $OUT_n$ of stage n is applied to an input terminal of subsequent stage n+1 of FIG. 1. Stage n+1 operates similarly to stage n except for utilizing clock signal C2, instead of clock signal C1 in stage n, for turning on the corresponding transistor. When clock signal C1 attains the inactive LOW level, transistor 16 remains turned on until signal P1 goes low. Signal $OUT_n$ of stage n goes low by virtue of discharge through transistor 16 when clock signal C1 is low.

A transistor 25 has its drain-source conduction path coupled between terminal 18a and a reference potential VSS1 sufficient to turn off pull-up transistor 16 when transistor 25 is conductive. The gate of transistor 25 of stage n is coupled to an output terminal of subsequent stage n+2 in the chain of FIG. 1 and is controlled by an output signal $OUT_{n+2}$. Signal $OUT_{n+2}$ is generated downstream of the pulse propagation path in register 100.

The pulse of signal $OUT_{n+2}$ occurs concurrently with clock signal C3 of FIG. 3b. The pulse of signal $OUT_{n+2}$ causes transistor 25 of FIG. 2 to discharge the aforementioned interelectrode capacitance CP at terminal 18a. Transistor 25 clamps the signal at terminal 18a to a level that prevents transistor 16 from generating any additional pulse of signal $OUT_n$ when the immediately following pulse of clock signal C1 occurs.

In accordance with an inventive feature, the pulse of signal $OUT_{n+2}$ is also coupled to a gate of a transistor 20 that is a TFI for turning on transistor 20. Transistor 20 applies a voltage VDD to terminal 21a for turning on transistors 17 and 19. Thus, transistor 20 is turned on only during the selection of one row out of, for example, 560 rows. Therefore, transistor 20 is turned on in a low duty cycle. Consequently, transistor 20 is not significantly stressed. The result is that threshold voltage drift of transistor 20 is reduced and its operational lifetime is increased.

Following the pulse of signal $OUT_{n+2}$, transistor 20 is turned off. However, a capacitor 32 that is coupled to the gate of transistors 17 and 19 stores a charge by the operation of transistor 20. The stored charge in capacitor 32 maintains transistors 17 and 19 conductive until the next scanning cycle, when the signal at terminal 12 causes transistor 21 to turn on and, thereby, transistors 17 and 19 to turn off. Capacitor 32 also provides noise filtering for the signal at terminal 12.

As long as transistor 17 is conductive, it operates as a pull-down transistor for applying a suitable impedance at terminal 13. Thus, transistor 17 sinks a current i17. Advantageously, the drain-source impedance of transistor 17 is sufficiently low to discharge the high level on the row select line and in addition it should be sufficiently low to sink any parasitic currents coupled to the row select line from the column lines of the LCD matrix. If parasitic currents are not dissipated by transistor 17, they may produce potentials that grow to a large magnitude sufficiently large to cause a false selection in the subsequent register stage. Thus, a false selection may be prevented provided that the threshold voltage of transistor 17 does not significantly increase over the operation life. Advantageously, when transistor 19 is conductive, it prevents clock signals C1 and C3 from turning on transistor 16.

A pulse at each output terminal of register 100 of FIG. 1, for example, the pulse of signal $OUT_{n+2}$ occurs only once during a vertical interval of approximately 16.6 millisecond. Therefore, advantageously, none of the switched transistors 18, 16, 20 and 25 of stage n of FIG. 2 is biased for conduction more than one clock period, during each vertical interval. On the other hand, transistors 17 and 19 are biased for continuous conduction, during most of the vertical interval. It may be desirable to reduce potentials applied to transistors 17 and 19 which may cause the threshold voltages of transistors 17 and 19 to increase and their current sinking capabilities to decrease.

To reduce stress in transistors 17 and 19, signal P2 at the gate of transistor 17 is established at a voltage level that is greater than the threshold voltage of transistor 17 by no more than, for example, 2 V at the start of the operational lifetime. Because a threshold voltage VTH of transistor 17 increases as a result of stress, it is desirable to compensate for such increase in threshold voltage VTH in a manner which keeps current conduction capability of transistors 17 and 19 substantially constant over the operation lifetime.

Advantageously, variable voltage VDD that controls the conductivity of transistors 17 and 19 is increased in a manner to track threshold voltage drift in transistors 17 and 19, during the operation lifetime. The variation in voltage VDD prevents a decrease in the conductivity of transistor 17, for example, that could result from threshold voltage drift of voltage VTH of transistor 17.

Figure 4:
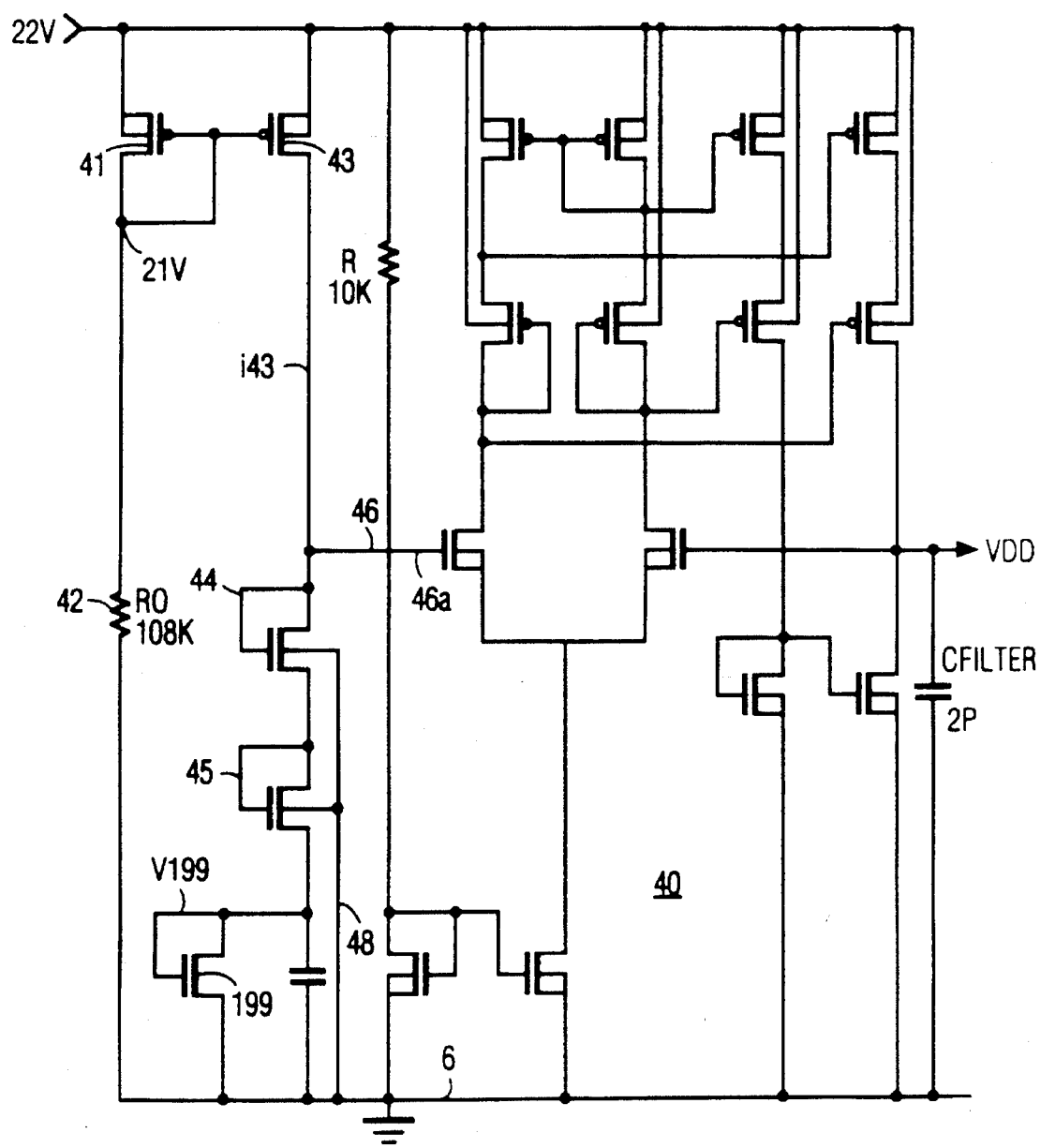
FIG. 4 illustrates a threshold voltage variation compensation arrangement, embodying an aspect of the invention, for the circuit of FIG. 2.

FIG. 4 illustrates a threshold voltage drift compensations circuit 40 that produces voltage VDD of FIGS. 2 and 4. Except for a TFT 199, the circuit elements of circuit 40 are formed separately from shift register 100 of FIG. 1 such that all other transistors of circuit 40 may be single crystal transistors and not TFT's. TFT 199 is formed together with shift register 100 of FIG. 1 on the glass of the LCD, and is used for sensing any threshold drift in the TFT's.

In circuit 40, a P-type MOS transistor 41 is coupled in series with a resistor 42 for producing a predetermined constant control current in transistor 41. A transistor 43 is coupled to transistor 41 in a current mirror configuration. Thus, the current i43 in transistor 43 is current mirror controlled by transistor 41. Current i43 is coupled to a series coupled arrangement of a transistor 44, a transistor 45 and TFT 199 that are N-type transistors. As a result of current i43, a threshold voltage compensating voltage 46a is developed at a terminal 46, across the series arrangement.

A gate electrode of TFT 199 is coupled to its drain electrode. Therefore, a source-drain voltage V199 across TFT 199 is equal to a source-gate voltage of TFT 199. Gate-source voltage V199 across TFT 199 provides a first portion of voltage 46a. Voltage V199 is indicative of the threshold voltage of transistor 199. Because TFT 199 has a similar threshold voltage variation characteristics as transistor 17 of FIG. 2, voltage V199 is also indicative of threshold voltage VTH of transistor 17. For design convenience, TFT 199 is a larger transistor. Therefore, a relatively larger magnitude of current i43 than that flowing in transistor 17 is used for developing voltage V199. When, as a result of stress, an increase in threshold voltage VTH occurs in transistor 17 of FIG. 2, a corresponding increase in voltage V199 of FIG. 4 occurs because of the similarly of characteristics and stress.

Each of transistors 44 and 45 that are coupled in series with TFT 199 has its gate coupled to its drain and has a substrate terminal that is coupled via a conductor 48 to a reference level G. A portion of voltage 46a that is developed in transistors 44 and 45 is summed up with voltage V199 to produce voltage 46a. In this way, voltage 46a is made larger by approximately 2 V than voltage V199. Voltage V199 is approximately equal to threshold voltage VTH of transistor 17 of FIG. 2 and increases when voltage VTH increases.

Voltage 46a is coupled to a non-inverting, unity gain amplifier for producing voltage VDD that is equal to voltage 46a. Voltage VDD is applied through transistor 20 of FIG. 2 for varying the voltage level of signal P2 of transistor 17.

The aforementioned voltage difference of, for example, 2 V that is produced by transistors 44 and 45 of FIG. 4 is attained at the beginning of the operation service of the LCD. During the service hours, the threshold voltage of transistor 199 increases. It may be desirable to have voltage 46a increase by more than the increase of voltage V199 for maintaining the same conductivity in transistor 17 of FIG. 2.

Advantageously, the substrate is biased at a level that is smaller than a source voltage of each of transistors 44 and 45, as indicated before. An increase in voltage V199 produces a channel modulation in each of transistors 44 and 45. The channel modulation is attained by the source-substrate voltage increase. As a result, the resistivity of each of transistors 44 and 45 increases along with the increase of voltage V199. In this way, advantageously, voltage 46a is increased in a non-linear manner. The increase in voltage 46a is proportionally larger than if transistors 44 and 45 operated as linear resistors, or simple level shifters. Advantageously, in this way, the conductivity of transistor 17 may be maintained relatively constant even when threshold voltage VTH of transistor 17 increases.

Figure 5:
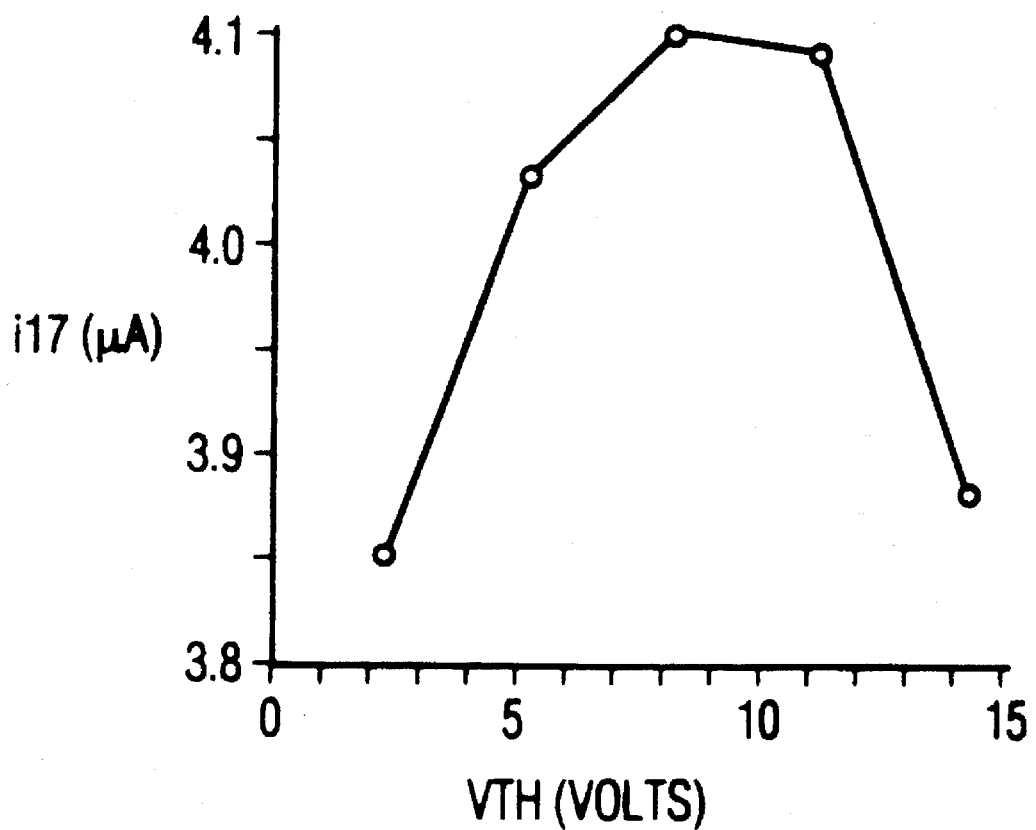
FIG. 5 illustrates a graph useful in explaining the operation of the FIG. 4 circuitry.

FIG. 5 shows an example of the magnitude of current i17 that transistor 17 can sink for a source-drain voltage maintained no greater than 50 mV. As shown in FIG. 5, current i17 changes by less than 5% for a corresponding change in threshold voltage VTH of about 10 V.

What is claimed is:

1. A shift register, comprising:

a source of a plurality of phase shifted clock signals;

a plurality of cascaded stages, a given one of said cascaded stages, including:

a first transistor of a push-pull amplifier responsive to a first clock signal of said clock signals for generating an output pulse at an output of said given stage;

an input section responsive to an output pulse developed at an output of a second of said cascaded stages when a clock signal that is phase shifted with respect to said first clock signal occurs for generating a control signal at a control electrode of said first transistor, said control signal conditioning said first transistor to generate said output pulse of said given stage when an active level of said first clock signal occurs;

a second transistor of said push-pull amplifier coupled to said output of said given stage for clamping said output to an inactive level of said output pulse; and a switching, third transistor responsive to an output pulse of a stage downstream of said given stage for applying a control signal to said second transistor.

2. A shift register according to claim 1 wherein said control signal conditions said second transistor for conduction to clamp said output.

3. A shift register according to claim 1 wherein said first transistor is a pull-up transistor and said second transistor is a pull-down transistor of said amplifier.

4. A shift register, comprising:

a source of a plurality of phase shifted clock signals;

a plurality of cascaded stages, a given one of said cascaded stages, including:

an output section responsive to a first clock signal of said clock signals for generating an output pulse at an output of said given stage when said first clock signal occurs;

an input section responsive to an output pulse developed at an output of a second of said cascaded stages when a clock signal that is phase shifted with respect to said first clock signal occurs;

a first transistor coupled to one of said input and output sections;

a source of a control signal; and a second transistor responsive to an output pulse of a stage of said cascaded stages downstream of said given stage for applying said control signal to a control terminal of said first transistor to render said first transistor conductive.

5. A shift register according to claim 4 wherein said output pulse of said stage downstream of said given stage turns on said second transistor with a low duty cycle and said second transistor stores a charge in a capacitance that renders said first transistor conductive with a high duty cycle.

6. A shift register according to claim 4 wherein said first transistor is a pull-down transistor of said output section.

7. A shift register according to claim 4 wherein said first transistor is coupled to a control terminal of a pull-up transistor of said output section.

\* \* \* \* \*